United States Patent [19]

Deville

[11] Patent Number: 4,999,522

[45] Date of Patent: Mar. 12, 1991

[54] ACTIVE RC FILTER CIRCUIT FOR USE AS A BAND-STOP FILTER

[75] Inventor: Yannick Deville, Ris-Orangis, France

[73] Assignee: U.S. Philips Corp., New York, N.Y.

[21] Appl. No.: 262,563

[22] Filed: Oct. 24, 1988

[30] Foreign Application Priority Data

Oct. 30, 1987 [FR] France .............................. 87 15079

[51] Int. Cl.[5] .......................... H03K 5/00; H03B 1/00
[52] U.S. Cl. .................................... 307/520; 328/167; 328/155
[58] Field of Search ................. 328/167, 155, 55, 165, 328/162; 307/520, 521, 511; 330/295, 302, 306; 333/173, 167, 172

[56] References Cited

U.S. PATENT DOCUMENTS

| | | | |
|---|---|---|---|
| 3,932,819 | 1/1976 | Spencer | 328/167 |
| 4,137,510 | 1/1979 | Iwahara | 328/167 |
| 4,388,595 | 6/1983 | Brooks | 328/155 |
| 4,716,388 | 12/1987 | Jacobs | 328/167 |

Primary Examiner—Timothy P. Callahan
Attorney, Agent, or Firm—Emmanuel J. Lobato

[57] ABSTRACT

A circuit forming an active RC filter for use as a band-stop filter in high and very-high frequency domains, having a second order transfer function, comprising a circuit that includes a building block for performing a filtering and amplifying function, and a building block $S_3$ for performing the summation $V_S$ of the circuit output signal and the signal $V_E$ applied to the input E of the circuit, characterized in that the filter building block is formed by a series arrangement of two filter building blocks $F_1$ and $F_2$ each having a first order all-pass function, and in that the circuit also includes an amplifier building block $A_1$ in a series arrangement with the filter building blocks $F_1$, $F_2$, inserted between the output of the latter building blocks and the output of the circuit, in that the input signal $V_E$ is applied on the other hand to the summation building block $S_3$ through an amplifier $A_2$, and in that the summation building block $S_3$ is formed by coupling the outputs of the amplifier building blocks $A_1$ and $A_2$ for forming the circuit output S at which the output signal $V_S$ is available and in that each building block $F_1$ and $F_2$ comprises a phase-shifting bridge associated to an amplifier stage.

8 Claims, 5 Drawing Sheets

ACTIVE RC FILTER CIRCUIT FOR USE AS A BAND-STOP FILTER

BACKGROUND OF THE INVENTION

The invention relates to a circuit forming an active RC filter to be used as a band-stop filter in the high and very-high frequency domains, having a second order transfer function, comprising a circuit that includes a building block for performing a filtering and an amplifying function, and a building block for performing the summation $V_S$ of the circuit output signal and the signal $V_E$ applied to the input of the circuit.

The invention is applied to the realisation of integrated circuits forming filters, in the high and very-high frequency domains, that can be used, for example in one embodiment, as band-stop filters in frequency doublers for rejecting the unwanted signal at the fundamental frequency or, in another embodiment, as a band-stop filter having differential inputs and outputs; or, in yet another embodiment, be particularly suitable for a fine adjustment of the rejection.

An active all-pass filter is already known from the prior art from the publication by J. TOW, in "IEEE Spectrum, December 1969, pp. 103–107", entitled "A Step-by-Step Active-filter Design".

This publication describes, among other things, an all-pass filter realisation having a second order transfer function, which filter is shown in FIG. 8 of the said document. This circuit comprises three operational amplifiers arranged in series and is looped back. A fourth operational amplifier performs the summation of the output signal of the first operational amplifier and the input signal of the filter circuit The operational amplifiers that are used for constituting this circuit have a gain which is most certainly infinite at low frequencies, but which becomes very low at high and very-high frequencies. Therefore, the circuit known from the said document has the disadvantage of not being suitable for use in these frequency domains.

Furthermore, the looped back circuit has the disadvantage to cause the circuit to oscillate in certain conditions.

FIG. 6 of the said document also shows an active band-pass filter that has similar characteristic features and thus exactly the same disadvantages.

The circuits known from the said document further have the following disadvantages: on the one hand, they are formed by a large number of transistors, which:

causes manufacturing to be costly in many cases requires a large surface and is disadvantageous for use in integrated circuits, entails high consumption and is also disadvantageous for the use as mentioned above.

On the other hand, their characteristic frequency is not adjustable.

Finally, the capacitors used in this circuit have considerable dimensions and render this circuit not integrable Therefore, the present invention has for its object to provide an active filter circuit that allows to get rid of these disadvantages and that specifically:

can operate at high or very-high frequencies;

and in the case of the use at very-high frequencies is easy to integrate, requires a small surface and has little consumption;

exhibits characteristic features so that the rejection frequency and the rejection are adjustable and easy to control;

can admit a differential input signal and a differential output signal.

SUMMARY OF THE INVENTION

According to the invention, this object is achieved by means of a circuit as described in the preamble, characterized in that the filter building block is formed by a series arrangement of two filter building blocks $F_1$ and $F_2$ each having a first order all-pass filter function, and in that the circuit also includes an amplifier building block $A_1$ in a series arrangement with the filter building blocks $F_1$, $F_2$, inserted between the output of the latter building blocks and the output of the circuit, in that the input signal $V_E$ is applied on the other hand to the summation building block $S_3$ through an amplifier $A_2$, and in that the summation building block $S_3$ is formed by coupling the outputs of the amplifier building blocks $A_1$ and $A_2$ for forming the circuit output S at which the output signal $V_S$ is available

BRIEF DESCRIPTION OF THE DRAWING

The invention will be better understood by means of the following description illustrated by the annexed drawings, in which.

DETAILED DESCRIPTION OF THE INVENTION

Figure 1:
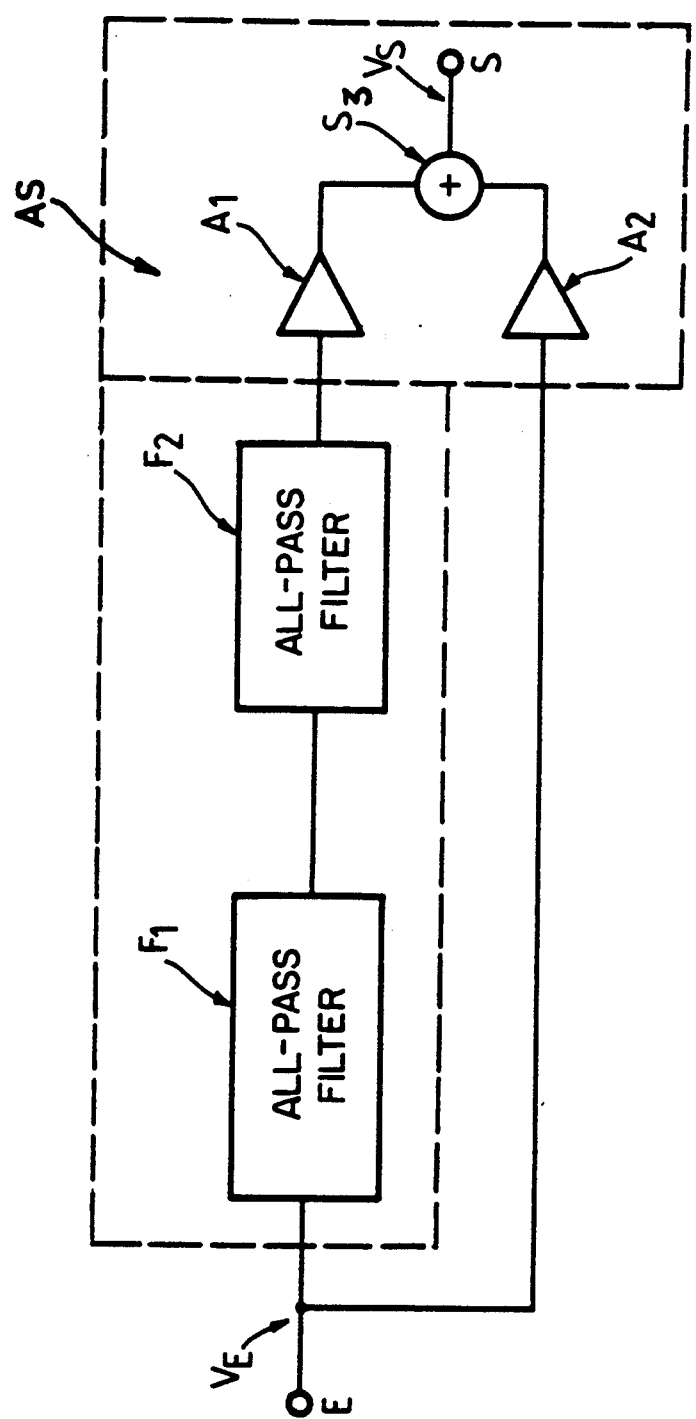
FIG. 1 represents the building block diagram of the circuit according to the invention.

In order to clarity the description of the invention it should first be recalled, that the transfer function of a second order all-pass active filter is $(p^2+1)/(p^2+aBp+1)$: see the Table on paqes 94–95 of the publication entitled "Filtres Actifs" by Paul BILDSTEIN in the "Editionsde la Radio" (9 Rue Jacob, PARIS, FRANCE).

For an ideal second order band-stop filter this transfer function can be described according to the relationship (1): of the Table I, in which relationship:

s is the Laplace variable that is derived from the variable p used in the aforementioned publication (p being the lower Laplace variable) by the relationship (2) of the Table I, also utilizing relationship (3) of Table I.

The other parameters of the transfer function (1) are defined in the abovementioned publication where $\omega_1$ is the rejection frequency for which the function (1) is absolutely $F(j\omega_1)=0$ and thus for which the rejection is complete;

$Q_0$ is the quality factor or selectivity actor which indicates the steepness of the slope of the curve $|F(j\omega)|$ in the neighbourhood of $\omega_1$;

$\omega_0$ is the angular frequency associated to the poles of the transfer function. Here it has been chosen to make the drive frequency $\omega_1$ correspond to the drive angular frequency $\omega_p$ of the above-referenced publication, within this publication $\omega_1 = \omega_0$.

G is the gain of the low-frequency circuit (if $\omega \rightarrow 0$ and $S \rightarrow 0$, the factor G is reduced to 1, and $F(j\omega) \rightarrow G$).

The transfer function of a non-ideal circuit, but having a real fixed structure, for which no requirements are made on the value of the elements, in the most simple case is of the second order and is expressed by the relationship (4) of Table I.

For practical reasons of simplicity one is here interested in the case in which $\omega_1 = \omega_0$ whatever the values of the filter elements are, and in which, $Q_1$ is the rejection factor, $|Q_1| > Q_0$ so that the filter operates in the band-stop mode, which leads us to two cases:

$$Q_1 > Q_0$$

and $$Q_1 < = Q_0.$$

Thus, there appears a novel filter parameter which is the rejection R of the filter provided by the relationship (5) of the Table I, if assuming that $\omega_1 \simeq \omega_0$.

The greater the absolute value of $Q_1$ (denoted $Q_1$), the better is the rejection R. At the limit value the rejection R is complete when $Q_1$ is infinite.

Well, the real band-stop filters can be subdivided into two categories:

the first category corresponds to the case in which $Q_1$ is finite, and greater than 0 ($Q_1 > 0$) whatever the filter elements. In these conditions, the filters cannot realise a total rejection. The maximum value $Q_1$ is the one that determines the filter limits. Actually, for a given value $Q_1$, if the value $Q_0$ enhances, the rejection R is diminished.

the second category corresponds to the case in which the fact that $Q_1$ is greater or smaller than 0 contrarily depends on the filter elements. In this case there are particular element values such as $(1/Q_1) = 0$, where the rejection R is complete. The transfer function G(s) provided by the relationship (4) is thus reduced to the function F(s) provided by the relationship (1).

The filters belonging to the second category especially have the property of being realised by choosing the elements such that $Q_1 = -Q_0$ (and always $\omega_1 = \omega_0$), so that the function (4):

$$|G(j\omega)| = G \text{ is constant.}$$

Thus, the filter becomes of the second order all-pass type. The phase difference between the output signals and input signals passes from 0 to $-2\pi$, when $\omega$ varies from 0 to infinity.

The main object of the invention is to realize active filters comprising the least possible number of elements in order to promote integration, and operating at high and very-high frequencies.

To this end, the integrated circuits of the filters according to the invention are advantageously realized with gallium arsenide (GaAs).

Furthermore, according to the invention, one has chosen to realise active band-stop filters of the second category, which permits to attain the following advantages:

a considerable and easily controllable rejection R an equally large selectivity as that of passive filters known from the state of the art mentioned hereinafter;

a D C. adjustable rejection factor $Q_1$.

The filters according to the invention will be advantageously used in frequency doublers for rejecting the unwanted signal at the fundamental frequency. The circuit according to the invention though being of the second category will not be used as a second order all-pass filter. Actually, it will be noticed that the filter itself is realised by means of all-pass filter elements each of the first order in an embodiment described hereinafter.

On the other hand, also known from the state of the art, there are band-stop filters of the second category operating at high frequencies But these circuits are realised by means of passive elements. For example, the circuit commonly referred to as "Robinson bridge" also known by the name of "Wien bridge", and represented on page 121 of the reference publication entitled "Electric Filters"by T. H. TURNEY (Ed. Pitman and Sons, London, England 1945) could be considered. This circuit, although it is capable of operating at very-high frequencies, has various disadvantages, specifically:

an output that has to be differential, a high output impedance, a zero gain, because it is realised by means of passive elements, generally speaking, difficult control and poor performance The block diagram of the band-stop filter circuit according to the invention is illustrated in FIG. 1. This circuit is formed by two parts defined by dashed lines. The first part is formed by the building blocks $F_1$ and $F_2$ each having the function of an all-pass filter, and the second part AS this the function of a summing amplifier.

The blocks $F_1$ and $F_2$ have for their transfer function the resPective relationships (6) and (7) of Table I.

The amplifier block AS is formed by an amplifier $A_1$ having gain $k_1$ and an amplifier $A_2$ having gain $k_2$. The amplifier $A_1$ is arranged in cascade with the filter blocks $F_1$ and $F_2$ while amplifier $A_2$ is arranged in parallel with the branch formed by $F_1$, $F_2$ and $A_2$. The adder $S_3$ sums the output signals of the amplifiers $A_1$ and $A_2$, and furnishes the output signal $V_S$ of the circuit according to the invention, whose input signal $V_E$ is applied to the junction of the filter block $F_1$ input and the amplifier $A_2$.

Consequently, the transfer function of the whole circuit of FIG. 1 is G(s), provided by the relationship (4), the parameters being defined by the relationships (8), (9), (10), (11) and (16).

In these relationships:

$\tau_1$ and $\tau_2$ are the respective time constants associated to the poles of the filter blocks $F_1$ and $F_2$;

$\tau'_1$ and $\tau'_2$ are the respective time constants associated to the zeroes of the filter blocks $F_1$ and $F_2$.

It should be observed that in the normal case:

$$\tau'_1 = \tau_1$$

$$\tau'_2 = \tau_2$$

and $\omega_1 = \omega_0$.

It should also be observed that the maximum $Q_0 = \frac{1}{2}$ is obtained for $\tau_1 = \tau_2$.

The circuit according to the invention thus forms a bandstop filter of the second category defined above, which can realise a total rejection.

Embodiment I

Figure 2A:
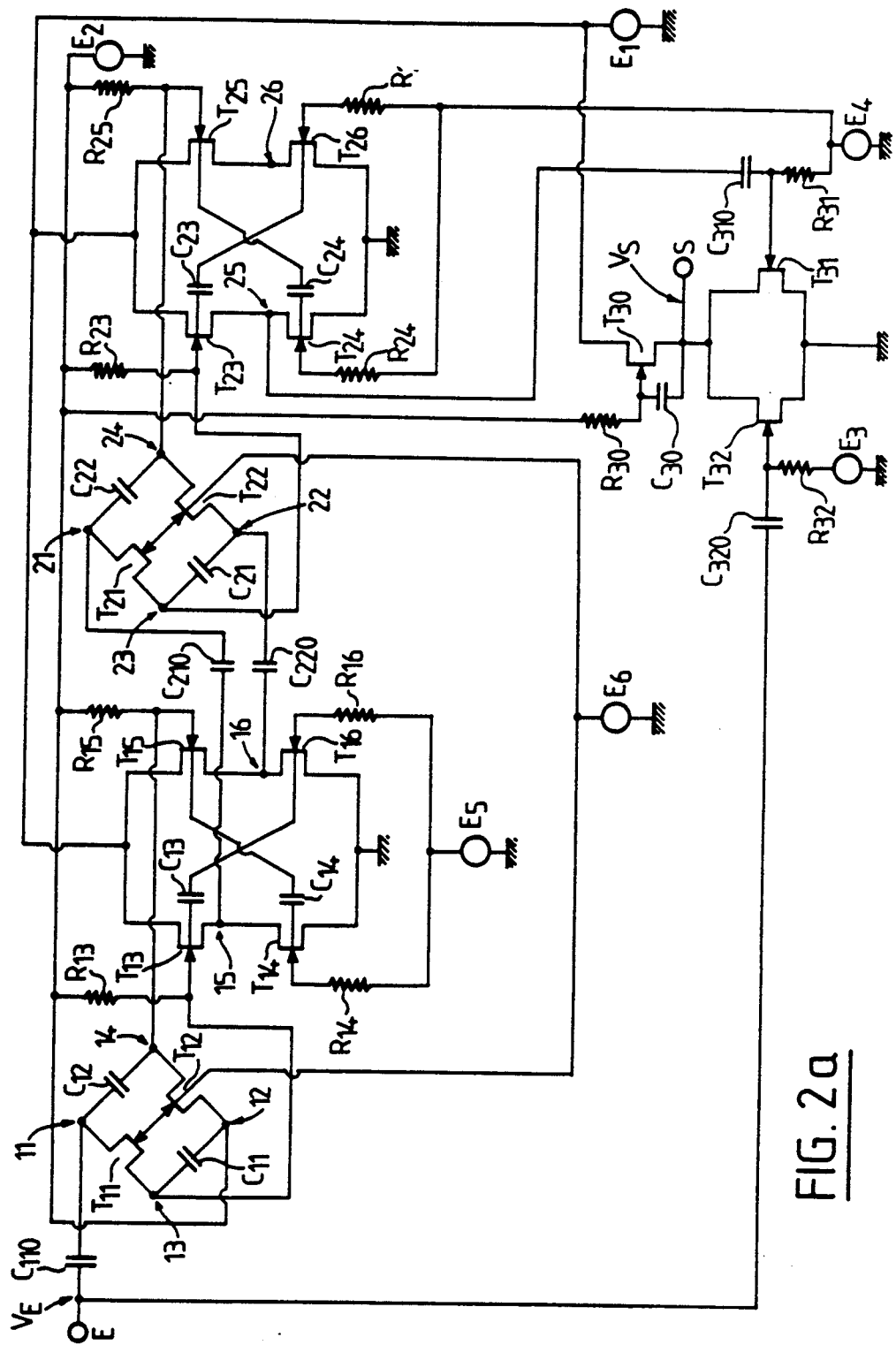
FIG. 2a represents an embodiment of the circuit according to the invention by means of field effect transistors.

A first embodiment of the circuit according to the invention is shown in FIG. 2a. This circuit of FIG. 2a is a basic version of the circuit according to the invention, which permits several variants whose characteristic features are shown in the other embodiments.

In the version of FIG. 2a, the all-pass (AP) filter blocks are identical. They each comprise a phase-shifting bridge, which is followed by a differential PUSH-PULL amplifier stage.

Each phase-shifting bridge comprises between the opposite nodes 11, 12 and 21, 22, for filters $F_1$ and $F_2$, respectively, in a first branch a resistor $R_{11}$, $R_{21}$, and a capacitor $C_{11}$, $C_{21}$; and in a second branch a capacitor $C_{12}$, $C_{22}$ and a resistor $R_{12}$, $R_{22}$. The output signal of each phase-shifting bridge is available at the junctions 13, 14 and 23, 24 for filters $F_1$ and $F_2$, respectively, of the resistors and capacitors of each branch.

Figure 3A:
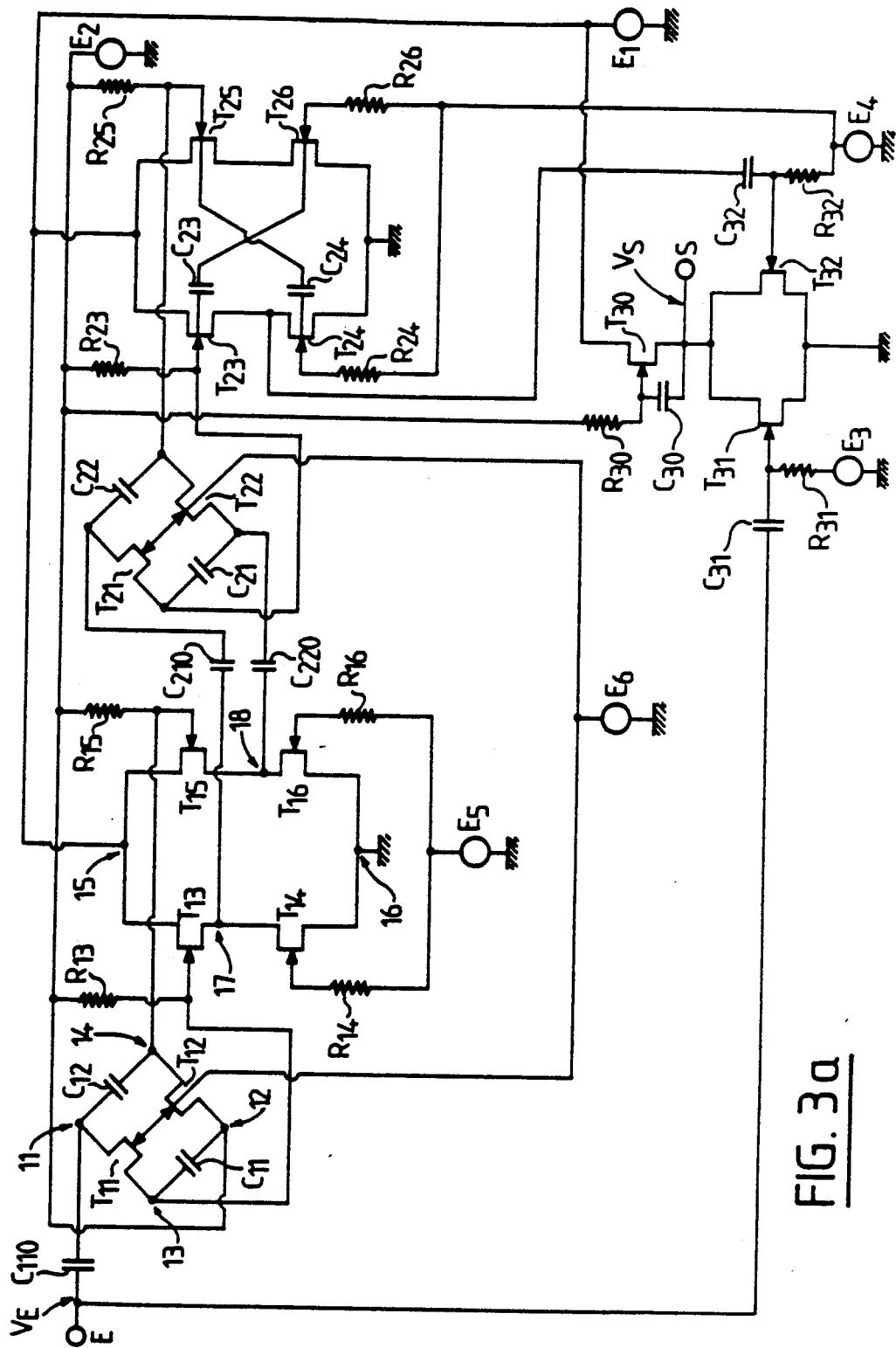
FIG. 3 represents a variant of the circuit according to the invention.
FIG. 3b represents another variant of the circuit according to the invention.
Figure 3B:
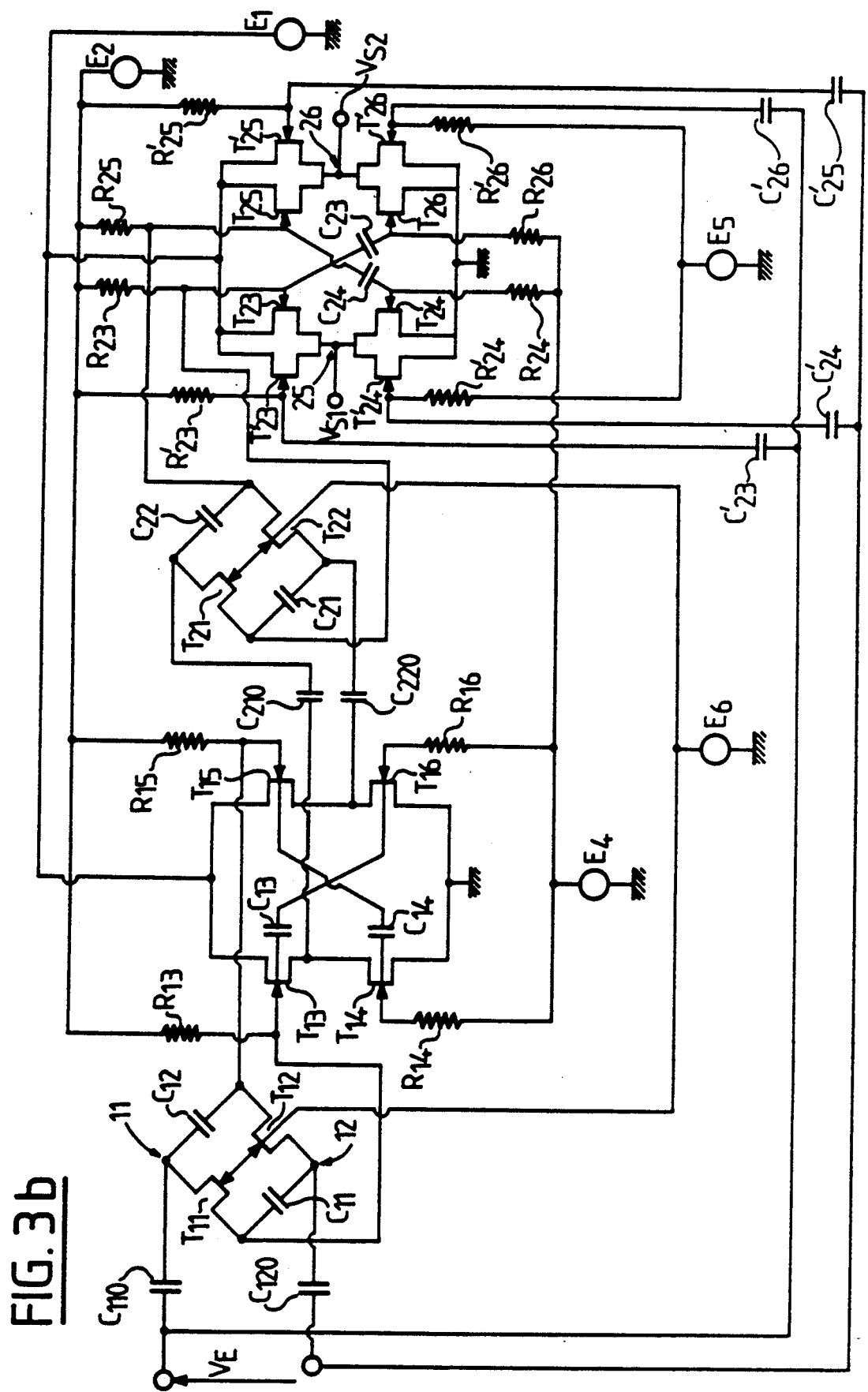

The resistors $R_{11}$, $R_{12}$, $R_{21}$, $R_{22}$ of the phase-shifting bridges are actually, as is represented in the FIGS. 2a, 3a, 3b, the respective field effect transistors (MESFET) $T_{11}$, $T_{12}$ for the phase-shifting bridge of the filter block $F_1$, and $T_{21}$, $T_{22}$ for the phase-shifting bridge of the filter block $F_2$. The source and the drain of these transistors form the ends of the resistors, and their gate receives a bias voltage $E_6$. These resistors are thus adjustable by controlling this voltage $E_6$ (see FIG. 2a). This control allows setting of the rejection frequency $f_1$ of the circuit according to the invention. A resistor arranged in series with $E_6$ protects the transistors $T_{11}$, $T_{12}$, $T_{21}$, $T_{22}$ and slightly enhance $f_1$.

The maximum rejection frequency $f_{1max}$ for the rejection R corresponds to a zero gate-source voltage ($V_{GS}=0$) for the transistors of the phase-shifting bridges, which is obtained for:

$$E_6 \text{maximum} = E_2 = 2.5V$$

for the example described above (see FIG. 2a).

The minimum frequency $f_{1min}$ for the rejection R corresponds to the minimum voltage chosen as a function of the threshold voltage of the transistor that can be applied between the gate and source of the transistors of the phase-shifting bridge, that is to say:

$V_{GS}\text{min} = -1.8V$, which is obtained for $E_6\text{min} = E_2 - 1.8V - 0.7V$ in this embodiment.

The ratio of the output voltages $V_{SP}$ of the nodes 13, 14 or 23, 24 to the input voltages $V_{EP}$ of the nodes 11, 12 or 21, 22 of the phase-shifting bridges is provided by the relationship (12) of Table I, in which relationship $R_0$ and $C_0$ are the resistances and capacitances of the different elements of the phase-shifting bridges.

Each filter block $F_1$ or $F_2$, having the function of an all-pass filter, subsequently comprises a differential amplifier stage of which each branch is of the PUSH-PULL type.

These amplifiers, as they are represented in FIG. 2a, comprise in a series arrangement a first branch comprised of a transistor at the top ($T_{13}$ and $T_{23}$ for filters $F_1$ and $F_2$, respectively,) L- and a transistor at the bottom ($T_{14}$ and $T_{24}$ for filters $F_1$ and $F_2$, respectively). This first branch is arranged in parallel with a second branch comprised of a transistor at the top ($T_{15}$ and $T_{25}$, respectively) and in series with a transistor at the bottom ($T_{16}$ and $T_{26}$, respectively).

The transistors at the top have common drains which are connected to a D.C. supply voltage $E_1$. The transistors at the bottom have common sources which are connected to ground.

The gates of the transistors at the top are connected to the respective output junctions of the phase-shifting bridge that precedes the amplifier stage, these junctions also being cross-connected to the gates of the transistors at the bottom of the same amplifier stage. Furthermore, the gates of the transistors at the top are biased through a resistor with a D.C. supply voltage $E_2$ ($R_{13}$ for $T_{13}$), ($R_{15}$ for $T_{15}$), ($R_{23}$ for $T_{23}$) and ($R_{25}$ for $T_{25}$). The gates of the transistors at the bottom are also biased with a voltage $E_5$ and $E_4$, respectively, for the filters $F_1$ and $F_2$. Isolating capacitors ($C_{13}$, $C_{14}$ for $F_1$ and $C_{23}$, $C_{24}$ for $F_2$, respectively) are inserted into the cross connections of the transistor gates at the top and at the bottom.

The output signal of each differential amplifier stage occurs between the junctions of the transistors at the top and at the bottom of each PUSH-PULL branch. The output signal of the amplifier stage filter $F_2$ occurs at the junction 25 between the transistors $T_{23}$ and $T_{24}$.

On the other hand, the input signal $V_E$ of the circuit is applied to the junction 11 of the first phase-shifting bridge through an isolating capacitor $C_{110}$, the junction 12 receiving a bias voltage $E_2$.

The signals the outputs 13 and 14 of the first phase-shifting bridge are applied to the gates of the transistors 13 and 15 of at the top of the amplifier stage of $F_1$ and to the gates of the transistors $T_{16}$ and $T_{14}$ at the bottom of this same amplifier. The signals of the outputs 15 and 16 of this amplifier are applied through isolating capacitors $C_{210}$ and $C_{220}$ to the inputs 21 and 22 of the phase-shifting bridge of block $F_2$. The signals of the outputs 23 and 24 of this phase-shifting bridge are applied to the gates of the transistors $T_{23}$ and $T_{25}$ at the top and to those of the transistors $T_{24}$ and $T_{26}$ at the bottom, cross-connected to the amplifier stage of $F_2$. The signal of the output 25 of this amplifier stage is available at the node of the transistors $T_{23}$ and $T_{25}$.

The transistors forming the PUSH-PULL differential amplifier stages are all field effect transistors.

The bias voltage $E_4$ applied to the gates of the transistors at the bottom of the amplifier stage $F_2$ is used for a coarse adjustment of the rejection R of the whole circuit, while the bias voltage $E_5$ applied to the gates of the transistors at the bottom of amplifier stage of $F_1$ is used for a fine adjustment of this rejection R.

The circuit according to the invention furthermore comprises an amPlifier $A_1$ arranged in series with the filter blocks $F_1$ and $F_2$. This amplifier $A_1$, as is represented in FIG. 2a, is formed by the field effect transistor $T_{31}$.

The source of this transistor $T_{31}$ is connected to ground and its drain is connected to the supply voltage $E_1$ via a charge. This charge is comprised of the transistor $T_{30}$ whose drain is connected to the supply voltage $E_1$, whose gate is biased over a resistor $R_{30}$ by the voltage $E_2$, its gate also being connected to its source across the capacitor $C_{30}$. The output signal of this amplifier stage $A_1$ is available at the drain of the transistor $T_{31}$.

The gate of the amplifier transistor $T_{31}$ (input of the amplifier $A_1$) receives across a capacitor $C_{310}$ the output signal of the PUSH-PULL amplifier stage of $F_2$ taken off at the node 25 of the transistors $T_{23}$, $T_{24}$. On the other hand, this gate is biased by the voltage $E_1$ through a resistor $R_{31}$.

The bias voltage $E_4$ simultaneously adjusts the gain $G_2$ of the filter block $F_2$ and the gain $k_1$ of the amplifier $A_1$; thus, it coarsely adjusts the rejection factor $Q_1$.

Conversely, the bias voltage $E_5$, which is supplied to the gates of the transistors at the bottom of the PUSH-PULL amplifier stage of filter block $F_1$, performs a fine adjustment of the gain of this amplifier stage and thus a fine adjustment of the rejection factor $Q_1$.

In this embodiment we choose:
$E_1 = 6V$
$E_2 = 2.5V$
$E_4$ will be adjusted for obtaining:
$E_5 \approx -0.8V$.

It should be observed that $E_2$ can be replaced by a resistance bridge inserted between $E_1$ and earth for diminishing the required number of voltage sources.

The circuit according to the invention also comprises an amplifier $A_2$ having gain $k_2$. This amplifier is formed by a field effect transistor $T_{32}$ arranged in parallel and thus admitting the same charge as the transistor $T_{31}(A_1)$. The amplifier transistor $T_{32}$ receives on its gate (input $A_2$) the input signal $V_E$ across an isolating capacitor $C_{320}$.

The common drains $T_{31}$ and $T_{32}$ perform the function of the summation element.$S_3$ (see FIG. 1). Besides, the gate of the amplifier transistor $T_{32}(A_2)$ the input signal $V_E$ across an isolating capacitor $C_{320}$.

The common drains $T_{31}$ and $T_{32}$ perform the function of the summation element $S_3$ (see FIG. 1). Besides, the gate of the amplifier transistor $T_{32}(A_2)$ is biased by a voltage $E_3$. This bias voltage is to remain fixed, but its value need not necessarily be very accurate ($E_3 \approx -0.8V$) should be used.

The arrangement represented in FIG. 2a adds a phase shift $\pi$ to the output signal $V_S$ available at the common drain of the transistors $T_{31}(A_1)$ and $T_{32}(A_2)$ when compared to the block diagram represented in FIG. 1.

For a bias voltage $E_6$ of the transistor gates of the phase-shifting bridges so that:
$E_6 = 2.5$, the rejection frequency is $f_1 = 3.23$ GHz,
$E_6 = 0.7V$, the rejection frequency is $f_1 = 0.90$ GHz.
the frequency band covered is very large.

On the other hand, if the bias voltage $E_5$ is adjusted with an accuracy of $\pm 25$ mV, the circuit according to the invention will guarantee:
a rejection $R \geq 56$ dB at $f_1 = 3.23$ GHz,
a rejection $R \geq 60$ dB at $f_1 = 0.90$ GHz.

These results are easily obtained, because the circuit according to the invention is particularly easy to adjust. Actually, it is simple to adjust the gain of each PUSH-PULL amplifier stage used. Therefore, in each building block $F_1$ and $F_2$, especially these amplifiers of the PUSH-PULL type have been chosen in preference to the classical inverted amplifiers.

It should also be observed that as the gain of the PUSH-PULL is adjusted better at the lowest frequencies, the rejection there is the best. However, it still remains very high. The low frequency gain of the whole circuit at the lowest rejection frequencies $f_1$ is of the order of 12 dB. It is 10 dB at the highest frequencies $f_1$.

The rejection frequency;
$f_1 = 3.23$ GHz is obtained for $E_4 = -1V$ and $E_5 \approx -0.85V$
$f_1 = 0.90$ GHz is obtained for $E_4 = -1.6V$ and $E_5 \approx -0.95V$.

Figure 2B:
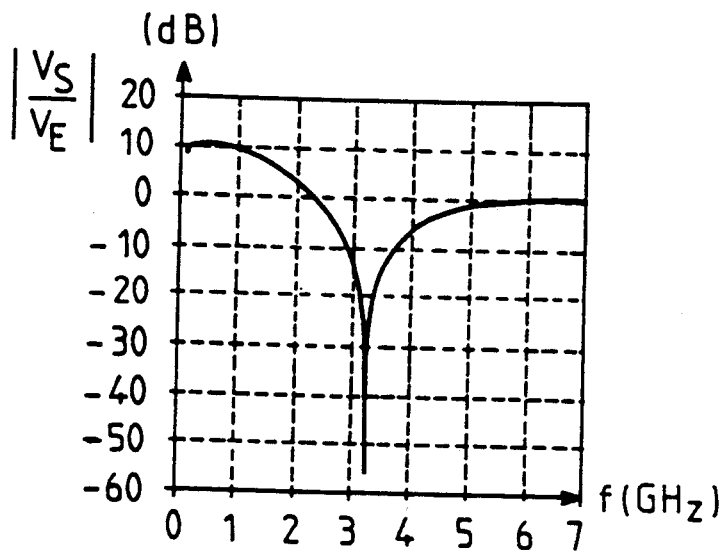
FIGS. 2b and 2c, respectively, represent the curves of the relationship between the output and input voltages of the circuit versus the frequency, and of the phase shift $\phi + \pi$ of the output signal and the input signal versus the frequency.
Figure 2C:
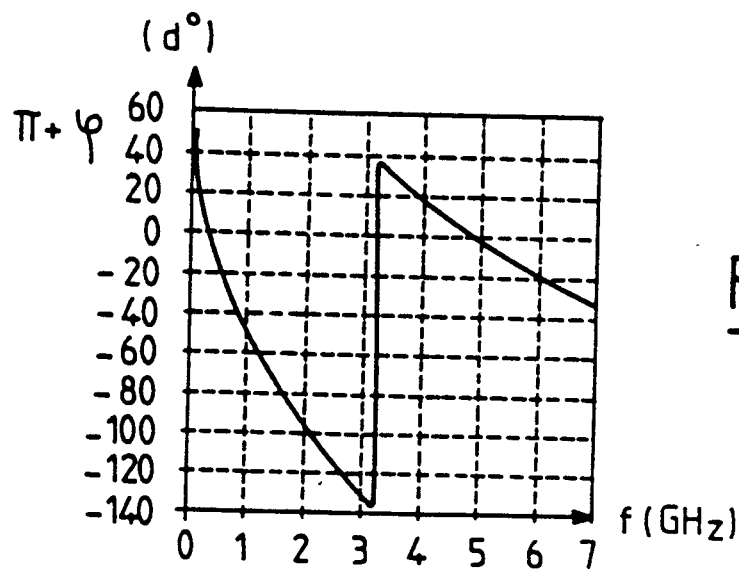

The FIGS. 2b and 2c present by way of example the computerized simulated characteristic values of the ratios of the signals $|V_S/V_E|$ in dB as a function of the operating frequency, which is expressed in GHz; and the value of the phase shift $\phi$ of the signals $V_S$ and $V_E$ as a function of the frequency expressed in GHz, for $E_4 = -1V$, $E_5 = -0.85V$, $E_6 - 2.5V$.

The circuit according to the invention specifically offers the advantage to make $f_1$ adjustable, resulting in:

(a) the possibility to correct the value of $f_1$, of which the integrated circuits always produce dispersed values, owing to the dispersion of the characteristic values of the elements in the various circuits;

(b) the possibility to use the same circuit with many different frequencies.

The Table II presents by way of a non-exhaustive example, values of the elements for the circuit as shown in FIG. 2a, with field effect transistors normally of the band-pass type in the absence of gate-source bias, presenting a threshold voltage of the order of:

$V_T = -2.5V$ and a gate length $l = 0.7 \mu m$.

The circuit according to the invention is realized by means of elements of Table II on a gallium arsenide substrate (GaAs).

By taking again equation (4) which, as will have been noticed, aPPlies to the present circuit, it has already been observed hereinbefore that: First, the filter circuit according to the invention is of the band-stop filter type if the relationship (13) is satisfied.

The structure according to the invention enables to attain that $Q_1$ is positive or negative and the relationship (14) satisfied. Secondly the circuit according to the invention also enables to attain that $Q_1 = -Q_0$, which corresponds to the case in which the circuit has the function of an all-pass filter. In addition, the circuit according to the invention allows to pass from the function of a band-stop filter to the function of an all-pass filter with the same elements.

Actually, it will be sufficient to make the gate bias voltages of the transistors of the different stages vary, to attain the variation
either of $k_1$,
or of $k_2$,
or of $G_1$
or of $G_2$
Then in a continuous manner we can pass from:
$Q_1 = -\infty$ (band-stop) to $Q_1 = -Q_0$ (all-pass).

Embodiment II

The second embodiment of the circuit according to the invention is shown in FIG. 3a. The circuit of FIG. 3a is a version that allows a finer adjustment of the gain and thus of the rejection. Consequently, the amplifiers of blocks $F_1$ and $F_2$ are not identical.

The amplifier of filter block $F_1$ does not have the gates of the top and bottom transistors cross-connected, and thus is not of the PUSH-PULL type. It is simply comprised of two followers of which the gain is smaller than in embodiment I, but which can be adjusted more accurately. Thus, the rejection can be adjusted in a simpler manner.

Thus, a choice may be made between the circuit of embodiment I and that of embodiment II according to the intended use.

In this embodiment II a D.C. voltage $E_5 \approx 0$ is now used, while maintaining therefor negative values ($E_5 < 0$). The values of the capacitors of the phase-shifting bridges are different from those of the embodiment 1 as is shown in Table III.

The rejection frequencies obtained are:
F$_1$=3.42 GHz, for E$_6$=2.5V
f$_1$=0.945 GHz, for E$_6$=0.7V.

The band covered by the frequency f$_1$ in the circuit of the embodiment II is also a little larger than that of embodiment I.

If the voltage E$_5$ is adjusted to ±25 mV, it is guaranteed that:
R≧59 dB with f$_2$=3.42 GHz
R≧61 dB with f$_1$=0.945 GHz.

The gain at the lowest frequencies is equal to 7.5 dB because the followers show less gain than the PUSH-PULL of the previous embodiment, as has already been stated.

To obtain the rejection frequencies
f$_1$=3.42 GHz, E$_4$ is to be equal to −0.85V, E$_5$≃−0.19V
f$_1$=0.945 GHz, E$_4$ is to be equal to −1.85V, E$_5$≃−0.28V.

Embodiment III

This embodiment allows differential operation (see FIG. 3b).

The differential inPut signal $V_E = V_{E2} - V_{E1}$ is applied between the nodes 11 and 12 of the phase-shifting bridge of the first building block F$_1$.

The output signal can be differential: this will be $V_S = V_{S1} - V_{S2}$, the voltage $V_{S1}$ being available at node 25 of the differential amplifier of the second filter block F$_2$ and the voltage $V_{S2}$ at the node 26. The output signal can also be obtained at ground reference; then one of the voltages should be used which is available either at node 25 or at node 26.

The amplifier A$_1$ is combined with the PUSH-PULL amplifier stage of block F$_2$. Thereto, the gates of the bottom transistors T$_{24}$, T$_{26}$ of this stage are biased by the same D.C. voltage E$_4$ as the one that biases the gates of the bottom transistors T$_{14}$, T$_{16}$ of the PUSH-PULL amplifier stage of filter block F$_1$. This allows coarse adjustment of the rejection of the whole circuit by adjusting E$_4$.

The amplifier A$_2$ is realized by adding field effect transistors T'$_{23}$, T'$_{24}$, T'$_{25}$, T'$_{26}$ in a parallel arrangement to the respective transistors T$_{23}$, T$_{24}$, T$_{25}$, T$_{26}$ of the PUSH-PULL amplifier of filter block F$_2$. The gates of the top transistors T'$_{23}$, T'$_{25}$ are cross-connected by means of capacitors C'$_{26}$, C'$_{23}$ and C'$_{25}$, C'$_{24}$ to the gates of the respective bottom transistors T'$_{26}$, T'$_{24}$.

On the other hand, these cross-connected gates receive the differential input signal. Then, the gates T'$_{23}$ and T'$_{26}$ are connected to the terminal 11 through the D.C. isolating capacitor C$_{110}$, and the gates of the transistors T'$_{25}$ and T'$_{24}$ are connected to the terminal 12 via the D.C. isolating capacitor C$_{120}$.

The gates of the transistors at the top T'$_{23}$ and T'$_{25}$ are also biased by the D.C. voltage E$_2$ through the resistors R'$_{23}$ and R'$_{25}$, while the bottom transistors T'$_{24}$, T'$_{26}$ are biased by the D C voltage E$_5$ through the resistors R'$_{24}$, R'$_{26}$ for the fine adjustment of the rejection.

Table III presents by way of a non-exhaustive example the values of the elements for the use of the circuit of FIG. 3b.

Adjusting the frequency f$_1$ is always effected by having the gates of the transistors of the phase-shifting bridges biased by E$_6$.

The summation S$_3$ is realized because the transistors of amplifiers A$_1$ and A$_2$ are arranged in parallel.

The rejection frequency:
f$_1$=3.85 GHz is obtained for E$_{6max}$=E$_2$=2.5V
f$_1$=0.906 GHz is obtained for E$_{6max}$=E$_2$−1.8V=0.7V.

The frequency band covered by f$_1$ is larger than in the embodiments described hereinbefore. This is because when the frequency f$_1$ is higher, the amplifier stages produce a phase delay leading to a diminishing of the frequency f$_1$. Since in this embodiment III the structure is such that the complete circuit comprises one stage less than in the embodiments I and II, the frequency f$_1$ is less affected by the phase shift caused by the amplifier stages.

If E$_5$, which is the fine adjustment of the rejection, is controlled to ±25 mV, it is guaranteed that:
R≧53 dB with f$_1$=3.85 GHz
R≧51 dB with f$_1$=0.906 GHz.

The gain at the lowest frequencies is of the order of 1 dB if the differential output signal $V_S = V_{S1} - V_{S2}$ is used at the nodes 25 and 26, and approximately −5 dB if an asymmetrical output signal $V_{S1}$ or $V_{S2}$ is used at 25 or 26.

On the other hand, the rejection frequency f$_1$=3.85 GHz is obtained for E$_4$=−0.8V, E$_5$≃−1.09V f$_1$=0.906 GHz is obtained for E$_4$=−1.95V, E$_5$≃−1.1V with the values of the elements of Table IV.

TABLE I $$F_{(s)} = G \cdot \frac{(s/\omega_1)^2 + 1}{(s/\omega_0)^2 + (1/Q_0)(s/\omega_0) + 1} \tag{1}$$

$$p = s/\omega_1 \tag{2}$$

$$s = j\omega \tag{3}$$

$$G(s) = G \cdot \frac{(s/\omega_1)^2 + (1/Q_1)(s/\omega_1) + 1}{(s/\omega_0)^2 + (1/Q_0)(s/\omega_0) + 1} \tag{4}$$

$$R = \frac{|F(j\omega)|_{maximum}}{|F(j\omega)|_{minimum}} \approx \frac{|F(0)|}{|F(j\omega_1)|} \approx \frac{|Q_1|}{Q_0} \tag{5}$$

$$G_1(s) = G_1 \times \frac{1 - \tau'_1 S}{1 + \tau_1 S} \tag{6}$$

$$G_2(s) = G_2 \times \frac{1 - \tau'_2 S}{1 + \tau_2 S} \tag{7}$$

$$\omega_0 = (\tau_1 \tau_2)^{-\frac{1}{2}} \tag{8}$$

$$\omega_1 = \left( \frac{k_1 + k_2 G_1 G_2}{k_1 \tau_1 \tau_2 + k_2 G_1 G_2 \tau'_1 \tau'_2} \right)^{\frac{1}{2}} \tag{9}$$

$$Q_0 = \frac{(\tau_1 \tau_2)^{\frac{1}{2}}}{\tau_1 + \tau_2} \tag{10}$$

$$G = k_1 + k_2 G_1 G_2 \tag{11}$$

$$\frac{V_{SP}}{V_{EP}} = \frac{1 - R_0 C_0 S}{1 + R_0 C_0 S} \tag{12}$$

$$|Q_1| > Q_0 \tag{13}$$

$$1/Q_1 = 0 \tag{14}$$

$$Q_1 = \frac{k_1 \tau_1 \tau_2 + k_2 G_1 G_2 \tau'_1 \tau'_2}{k_1 (\tau_1 + \tau_2) - k_2 G_1 G_2 (\tau'_1 + \tau'_2)} \tag{16}$$

TABLE II (FIG. 2a)

| Resistors | | Capacitors | | Transistors | | Supply | |
|---|---|---|---|---|---|---|---|
| R | kΩ | $C_{11}$ | pF | t (λ) | μm | E | V |
| $R_{13}$ | 10 | $C_{11}$ | 0.13 | $T_{11}$ | 10 | $E_1$ | 6 |
| $R_{15}$ | 10 | $C_{12}$ | 0.13 | $T_{12}$ | 10 | $E_2$ | 2.5V |
| $R_{14}$ | 10 | $C_{13}$ | 1 | $T_{13}$ | 40 | $E_3$ | −0.8 |
| $R_{16}$ | 10 | $C_{14}$ | 1 | $T_{14}$ | 40 | $E_4$ | |
| $R_{23}$ | 10 | $C_{21}$ | 0.13 | $T_{15}$ | 40 | $E_5$ | |
| $R_{25}$ | 10 | $C_{22}$ | 0.13 | $T_{16}$ | 40 | $E_6$ | |
| $R_{24}$ | 10 | $C_{23}$ | 1 | $T_{21}$ | 10 | | |
| $R_{26}$ | 10 | $C_{24}$ | 1 | $T_{22}$ | 10 | | |
| $R_{30}$ | 10 | $C_{30}$ | 1 | $T_{23}$ | 40 | | |
| $R_{31}$ | 10 | $C_{310}$ | 1 | $T_{24}$ | 40 | | |
| $R_{32}$ | 10 | $C_{320}$ | 1 | $T_{25}$ | 40 | | |
| | | $C_{110}$ | 1 | $T_{26}$ | 40 | | |
| | | $C_{210}$ | 1 | $T_{30}$ | 25 | | |
| | | $C_{220}$ | 1 | $T_{31}$ | 35 | | |
| | | | | $T_{32}$ | 10 | | |

$E_4$ = coarse adjustment of rejection R
$E_5$ = fine adjustment of rejection R
$E_6$ = adjustment of rejection frequency $f_1$

TABLE III (FIG. 3a)

| Resistors | | Capacitors | | Transistors | | Supply | |
|---|---|---|---|---|---|---|---|
| R | kΩ | $C_{11}$ | pF | T (λ) | μm | E | V |
| $R_{13}$ | 10 | $C_{11}$ | 0.12 | $T_{11}$ | 10 | $E_1$ | 6 |
| $R_{14}$ | 10 | $C_{12}$ | 0.12 | $T_{12}$ | 10 | $E_2$ | 2.5V |
| $R_{15}$ | 10 | $C_{21}$ | 0.12 | $T_{13}$ | 40 | $E_3$ | −0.8 |
| $R_{16}$ | 10 | $C_{22}$ | 0.12 | $T_{14}$ | 25 | $E_4$ | |
| $R_{23}$ | 10 | $C_{23}$ | 1.- | $T_{15}$ | 40 | $E_5$ | |
| $R_{24}$ | 10 | $C_{24}$ | 1.- | $T_{16}$ | 25 | $E_6$ | |
| $R_{25}$ | 10 | $C_{30}$ | 1.- | $T_{21}$ | 10 | | |
| $R_{26}$ | 10 | $C_{31}$ | 1.- | $T_{22}$ | 10 | | |
| $R_{30}$ | 10 | $C_{32}$ | 1.- | $T_{23}$ | 40 | | |
| $R_{31}$ | 10 | $C_{110}$ | 1.- | $T_{24}$ | 40 | | |
| $R_{32}$ | 10 | $C_{210}$ | 1.- | $T_{25}$ | 40 | | |
| | | $C_{220}$ | 1.- | $T_{26}$ | 40 | | |
| | | | | $T_{30}$ | 45 | | |
| | | | | $T_{31}$ | 10 | | |
| | | | | $T_{32}$ | 70 | | |

$E_4$ = coarse adjustment of rejection R
$E_5$ = fine adjustment of rejection R
$E_6$ = adjustment of rejection frequency $f_1$

TABLE IV (FIG. 3b)

| Resistors | | Capacitors | | Transistors | | Supply | |
|---|---|---|---|---|---|---|---|
| R | kΩ | $C_{11}$ | pF | T (λ) | μm | E | V |
| $R_{13}$ | 10 | $C_{11}$ | 0.13 | $T_{11}$ | 10 | $E_1$ | 6 |
| $R_{14}$ | 10 | $C_{12}$ | 0.13 | $T_{12}$ | 10 | $E_2$ | 2.5 |
| $R_{15}$ | 10 | $C_{13}$ | 1 | $T_{13}$ | 40 | $E_4$ | |
| $R_{16}$ | 10 | $C_{14}$ | 1 | $T_{14}$ | 40 | $E_5$ | |
| $R_{23}$ | 10 | $C_{21}$ | 0.13 | $T_{15}$ | 40 | $E_6$ | |
| $R'_{23}$ | 10 | $C_{22}$ | 0.13 | $T_{16}$ | 40 | | |
| $R_{24}$ | 10 | $C_{23}$ | 1 | $T_{21}$ | 10 | | |
| $R'_{24}$ | 10 | $C_{24}$ | 1 | $T_{22}$ | 10 | | |
| $R_{25}$ | 10 | $C'_{23}$ | 1 | $T_{23}$ | 30 | | |
| $R'_{25}$ | 10 | $C'_{24}$ | 1 | $T'_{23}$ | 10 | | |
| $R_{26}$ | 10 | $C'_{25}$ | 1 | $T_{24}$ | 30 | | |
| $R'_{26}$ | 10 | $C'_{26}$ | 1 | $T'_{24}$ | 10 | | |
| | | $C_{110}$ | 1 | $T_{25}$ | 30 | | |
| | | $C_{120}$ | 1 | $T'_{25}$ | 10 | | |
| | | $C_{210}$ | 1 | $T_{26}$ | 30 | | |

TABLE IV-continued (FIG. 3b)

| Resistors | | Capacitors | | Transistors | | Supply | |
|---|---|---|---|---|---|---|---|
| R | kΩ | $C_{11}$ | pF | T (λ) | μm | E | V |
| | | $C_{220}$ | 1 | $T'_{26}$ | 10 | | |

$E_4$ = coarse adjustment of rejection R
$E_5$ = fine adjustment of rejection R
$E_6$ = adjustment of rejection frequency $f_1$

What is claimed is:

1. An active RC filter circuit, comprising:
   a first filter receptive of the filter circuit input signal and having a first order all-pass filter function;
   a second filter having a first order all-pass filter function connected in series with said first filter;
   a first amplifier connected for receiving the output of said second filter;
   a second amplifier connected for receiving the input of the active filter circuit; and
   summing means for summing the respective outputs of said first and second amplifiers for developing the output of the active filter circuit.

2. An active RC filter circuit according to claim 1, wherein said summing means is comprised of means for coupling the respective outputs of said first and second amplifiers.

3. An active RC filter circuit according to claim 2, wherein each of said first and second filters comprise a phase-shifting bridge circuit and an amplifier for amplifying the output of said bridge circuit.

4. An active RC filter circuit according to claim 1, wherein each of said first and second filters comprise a phase-shifting bridge circuit and an amplifier for amplifying the output of said bridge circuit.

5. An active RC filter circuit according to claim 1, wherein each of said first and second filters comprise
   a phase-shifting bridge circuit, said phase-shifting bridge circuit comprising a pair of parallel branches between two nodes defining the input nodes of said bridge circuit, a first of said branches comprising a first resistor and a first capacitor in series between said bridge input nodes, the second of said branches comprising a second capacitor and a second resistor in series between said bridge input nodes and in an order opposite that of said first capacitor and said first resistor, the respective capacitor and resistor comprising said first branch and said second branch joining at a node, and the nodes of each branch together defining the output of said phase-shifting bridge circuit; and
   an amplifier for amplifying the output signal from said phase-shifting bridge.

6. An active RC filter circuit according to claim 5, wherein said first resistor and said second resistor are adjustable in value for tuning the rejection frequency of the filter circuit.

7. An active RC filter circuit according to claim 5, wherein said first resistor and said second resistor are comprised of field effect transistors having gate regions which are biasable for changing the resistance thereof for tuning the rejection frequency of the filter circuit.

8. An active RC filter circuit according to claim 5, wherein said amplifier is a differential amplifier.

* * * * *